US012775214B2

(12) United States Patent
Ryu et al.

(10) Patent No.: US 12,775,214 B2
(45) Date of Patent: Oct. 27, 2026

(54) METHOD OF FORMING PHOTORESIST PATTERNS AND BAKING EQUIPMENT

(71) Applicant: Samsung Electronics Co., Ltd., Suwon-si (KR)

(72) Inventors: Hyungju Ryu, Suwon-si (KR); Dokyeong Kwon, Suwon-si (KR); Sangjin Kim, Suwon-si (KR); Changmin Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 298 days.

(21) Appl. No.: 18/432,182

(22) Filed: Feb. 5, 2024

(65) Prior Publication Data

US 2025/0004381 A1 Jan. 2, 2025

(30) Foreign Application Priority Data

Jun. 29, 2023 (KR) ........................ 10-2023-0084165

(51) Int. Cl.
*G03F 7/38* (2006.01)

(52) U.S. Cl.
CPC ..................................... *G03F 7/38* (2013.01)

(58) Field of Classification Search
CPC .......... G03F 7/38; G03F 7/168; G03F 7/0045; H05B 3/0047; H10P 72/0434; H10P 72/0436; H10P 76/2041
See application file for complete search history.

(56) References Cited

U.S. PATENT DOCUMENTS

| | | | |
|---|---|---|---|
| 6,518,548 B2 | 2/2003 | Sugaya et al. | |
| 6,573,480 B1 * | 6/2003 | Rangarajan | H10P 72/0602 219/390 |
| 6,686,132 B2 | 2/2004 | Cheng et al. | |
| 6,801,295 B2 | 10/2004 | Inomata et al. | |
| 7,845,868 B1 * | 12/2010 | Huang | G03D 5/00 396/611 |
| 7,883,824 B2 | 2/2011 | Asano et al. | |
| 8,623,458 B2 | 1/2014 | Cheng et al. | |
| 8,765,363 B2 | 7/2014 | Wang et al. | |
| 8,828,493 B2 * | 9/2014 | Cheng | G03F 7/165 430/323 |
| 9,354,521 B2 * | 5/2016 | Lai | G03F 7/26 |
| 10,345,718 B2 | 7/2019 | Wang et al. | |
| 11,429,026 B2 | 8/2022 | Dai et al. | |
| 2018/0158827 A1 | 6/2018 | You et al. | |
| 2021/0159230 A1 | 5/2021 | Choi et al. | |

OTHER PUBLICATIONS

Extended European Search Report dated Apr. 28, 2025, in connection with European Application No. 24220497.2.

* cited by examiner

*Primary Examiner* — Hung V Nguyen
(74) *Attorney, Agent, or Firm* — Wolf, Greenfield & Sacks, P.C.

(57) ABSTRACT

Methods of forming a photoresist pattern are provided. A photoresist layer may be formed on a substrate. An exposure process may be performed on the photoresist layer. A post exposure baking (PEB) process may be performed on the photoresist layer with a temperature gradient in the photoresist layer in a vertical direction substantially perpendicular to an upper surface of the substrate. A development process may be performed on the photoresist layer.

18 Claims, 12 Drawing Sheets

METHOD OF FORMING PHOTORESIST PATTERNS AND BAKING EQUIPMENT

CROSS-REFERENCE TO RELATED APPLICATION

This application claims priority under 35 U.S.C. § 119 to Korean Patent Application No. 10-2023-0084165 filed on Jun. 29, 2023 in the Korean Intellectual Property Office, the disclosure of which is hereby incorporated by reference in its entirety.

BACKGROUND

Example embodiments of the present disclosure relate to a method of forming a photoresist pattern and a baking equipment.

A photoresist pattern is formed by forming a photoresist layer on a substrate, performing an exposure process on the photoresist layer, performing a post exposure baking (PEB) process on the photoresist layer, and performing a development process on the photoresist layer. The photoresist layer includes photo acid generator (PAG), and as the exposure process is performed, acid is generated from the PAG in an exposed portion of the photoresist layer. During the PEB process, the acid may diffuse to serve as catalyst in a deprotection reaction of polymer included in the photoresist layer, so that the polymer is easily removed during the development process.

The acid diffuses in a random direction during the PEB process and thus diffuses into a non-exposed portion adjacent to the exposed portion in a horizontal direction as well as the exposed portion of the photoresist layer. Accordingly, a sidewall of an opening that is formed in the photoresist layer by removing the exposed portion of the photoresist layer during the development process has a random slope in a vertical direction and a random shape in the horizontal direction.

SUMMARY

Example embodiments provide a method of forming a photoresist pattern having enhanced characteristics.

Example embodiments provide a baking equipment having enhanced characteristics.

According to example embodiments of the inventive concepts, there is provided a method of forming a photoresist pattern. In the method, a photoresist layer may be formed on a substrate. An exposure process may be performed on the photoresist layer. A post exposure baking (PEB) process may be performed on the photoresist layer with a temperature gradient in the photoresist layer in a vertical direction substantially perpendicular to an upper surface of the substrate. A development process may be performed on the photoresist layer.

According to example embodiments of the inventive concepts, there is provided a method of forming a photoresist pattern. In the method, a photoresist layer may be formed on a substrate. An exposure process may be performed on the photoresist layer. A post exposure baking (PEB) process may be performed on the photoresist layer by providing the substrate into a space between a heat sink and a heat source of a baking chamber. A development process may be performed on the photoresist layer.

According to example embodiments of the inventive concepts, there is provided a baking apparatus. The baking equipment may include a baking chamber, a heat sink in a lower portion of the baking chamber, a heat source in an upper portion of the baking chamber, and a controller configured to control the heat sink and the heat source such that a temperature gradient may be formed between upper and lower surfaces of a photoresist layer formed on a substrate that is provided into a space between the heat source and the heat sink.

The photoresist pattern in accordance with example embodiments may have enhanced line edge roughness (LER) characteristics and enhanced line width roughness (LWR) characteristics.

DETAILED DESCRIPTION

The above and other aspects and features of the inventive concepts will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

In the specification (and not necessarily in the claims), two directions among horizontal directions that are substantially parallel to an upper surface of a substrate may be referred to as first and second directions D1 and D2, respectively, and a vertical direction substantially perpendicular to the upper surface of the substrate may be referred to as a third direction D3.

Figure 3:
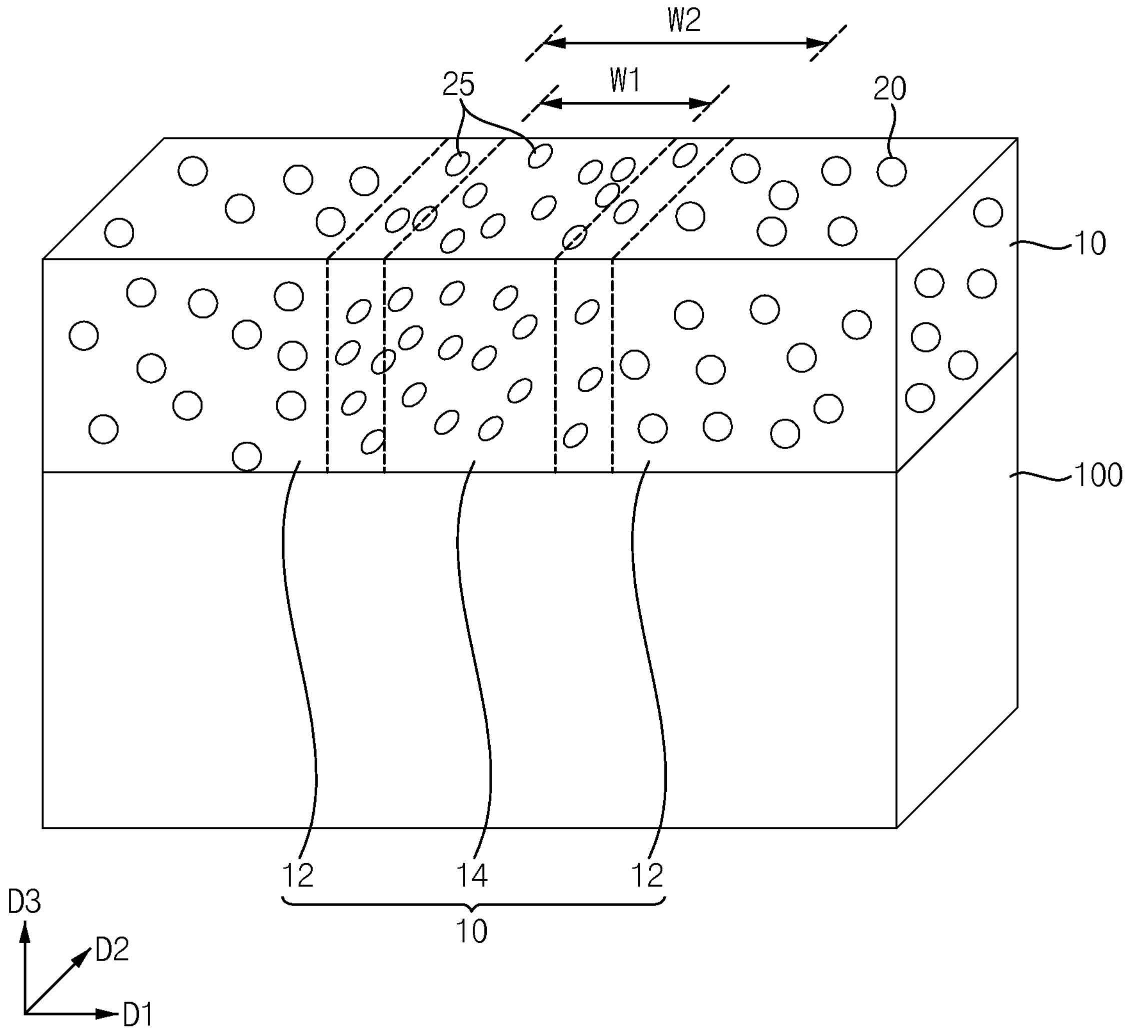
Figure 4:
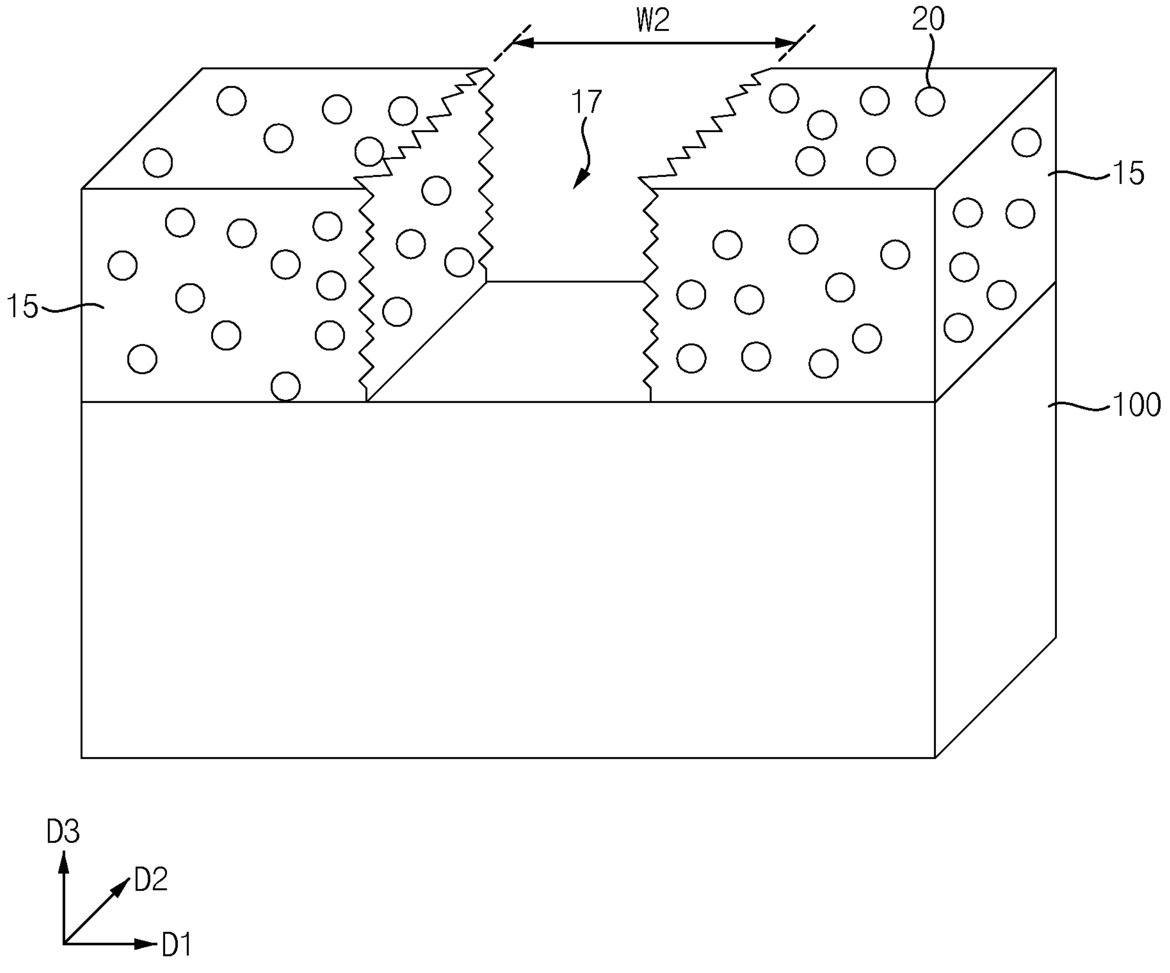
Figure 5:
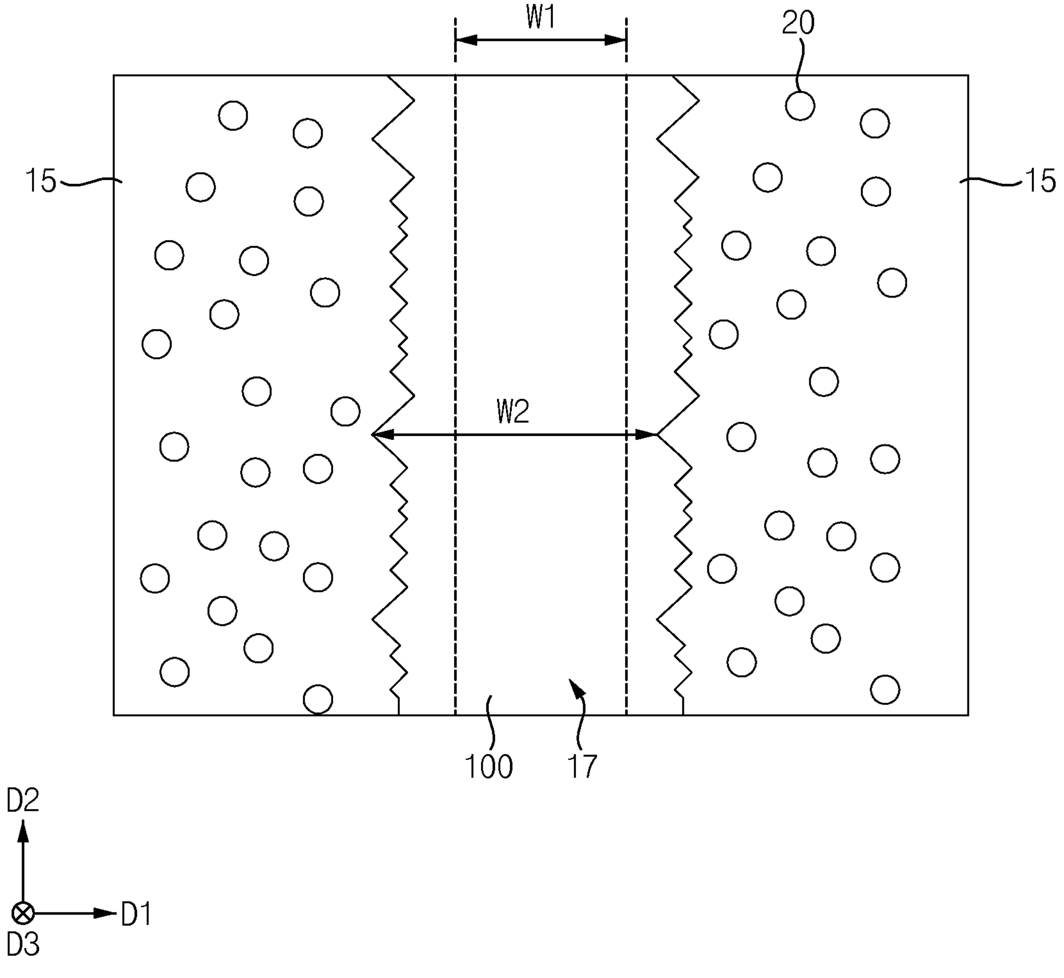
FIG. 5 is a plan view illustrating the method of forming the photoresist pattern.

FIGS. 1 to 4 are perspective views illustrating a method of forming a photoresist pattern in accordance with a comparative embodiment, and FIG. 5 is a plan view illustrating the method of forming the photoresist pattern.

Figure 1:
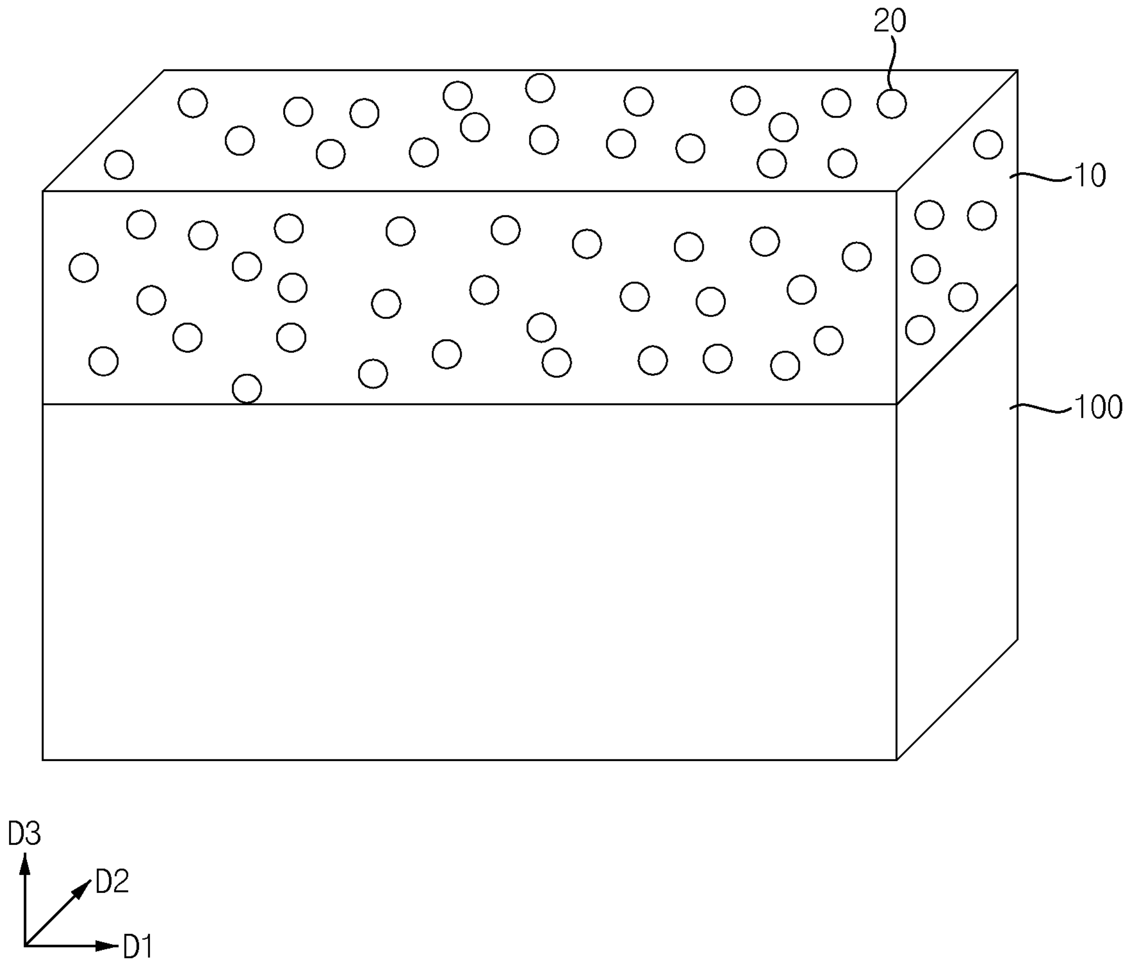
FIGS. 1 to 4 are perspective views illustrating a method of forming a photoresist pattern in accordance with a comparative embodiment.

Referring to FIG. 1, a photoresist layer 10 is formed on a substrate 100.

The photoresist layer 10 includes photo acid generators (PAGs) 20 in an inside of the photoresist layer 10.

Figure 2:
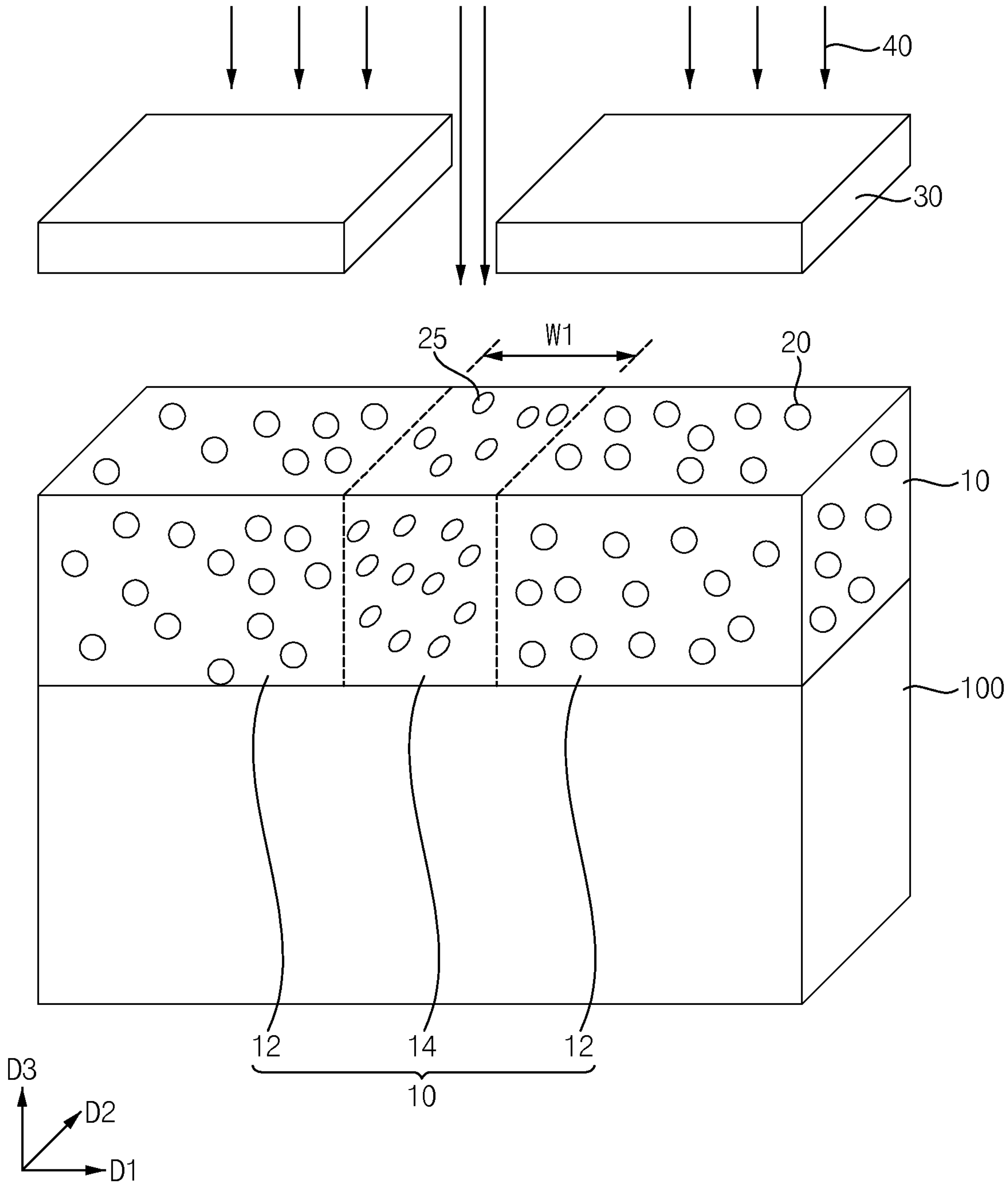

Referring to FIG. 2, a photomask 30 is disposed over the photoresist layer 10, and an exposure process in which a light 40 is irradiated onto the substrate 100 is performed.

As the exposure process is performed, the photoresist layer 10 includes an exposed portion 14 into which the light

40 is irradiated through the photomask 30 and a non-exposed portion 12 to which the light 40 is not irradiated by the photomask 30.

The exposed portion 14 has a first width W1 in the first direction D1.

As the exposure process is performed, acids 25 are generated from the PAGs 20 in the exposed portion 14 of the photoresist layer 10.

Referring to FIG. 3, a post exposure baking (PEB) process is performed on the photoresist layer 10.

As the PEB process is performed, the acids 25 in the exposed portion 14 of the photoresist layer 10 diffuse. The acids 25 diffuse in a random direction, and thus some of the acids 25 also diffuse into a portion of the non-exposed portion 12 adjacent to the exposed portion 14 in the first direction D1. Accordingly, the acids 25 exist in a portion of the photoresist layer 10 having a second width W2 in the first direction D1 that is greater than the first width W1.

When the acids 25 diffuse in the exposed portion 14 and the portion of the non-exposed portion 12 adjacent to the exposed portion 14, the acids 25 serve as a catalyst of deprotection reaction of polymers, and thus the polymers in the exposed portion 14 and the portion of the non-exposed portion 12 are removed during a subsequent development process.

Referring to FIG. 4, the development process is performed on the photoresist layer 10 to form a photoresist pattern 15.

The development process is performed using an alkaline developing solution, and during the development process, not only the exposed portion 14 but also the portion of the non-exposed portion 12 adjacent to the exposed portion 14 in which the acids 25 exist are removed. Thus, a first opening 17 extending through the photoresist pattern 15 has a second width W2 in the first direction D1 that is greater than the first width W1.

The acids 25 diffuse in the random direction in the PEB process, and thus each of opposite sidewalls in the first direction D1 of the first opening 17 in the photoresist pattern 15 does not have a uniform slope in the third direction D3, but has irregular slopes.

Referring to FIG. 5, each of opposite sidewalls in the first direction D1 of the first opening 17 in the photoresist pattern 15 is not formed in a straight line in the second direction D2, but the second width W2 in the first direction D1 of the first opening 17 changes irregularly in the second direction D2.

Accordingly, the photoresist pattern 15 in accordance with the comparative embodiment includes the first opening 17 having the second width W2 that is greater than the first width W1, which is initially designed, and the second width W2 in the first direction D1 of the first opening 17 changes along both the second and third directions D2 and D3. Thus, the photoresist pattern 15 has deteriorated line edge roughness (LER) characteristics and deteriorated line width roughness (LWR) characteristics.

Figure 6:
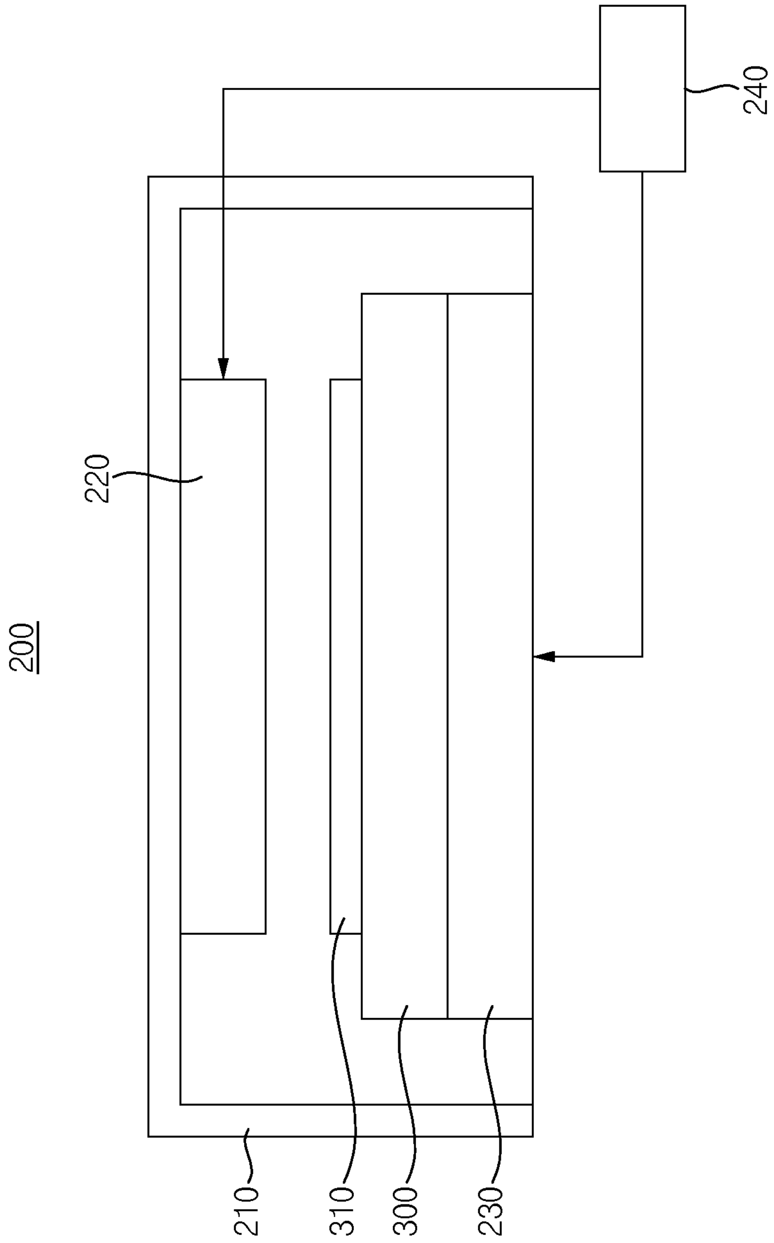
FIG. 6 is a cross-sectional view illustrating a baking equipment in accordance with example embodiments of the present inventive concept.

FIG. 6 is a cross-sectional view illustrating a baking equipment in accordance with example embodiments of the present inventive concept. As used herein, the term "equipment" may be interchangeable with "apparatus."

Referring to FIG. 6, a baking equipment 200 may include a baking chamber 210, a heat source 220, a heat sink 230 and a controller 240.

The heat source 220 may be disposed in an upper portion of the baking chamber 210, and the heat sink 230 may be disposed in a lower portion of the baking chamber 210. In some embodiments, the heat source 220 and the heat sink 230 may be spaced apart from each other in a vertical direction as illustrated in FIG. 6.

The heat source 220 may include, e.g., a laser generator, a lamp heater, etc.

The heat sink 230 may include, e.g., a chill plate, a cold plate, a cooling plate, etc.

A substrate 300 may be mounted on and contact the heat sink 230, and a photoresist layer 310 may be formed on the substrate 300. The vertical direction may be a thickness direction of the photoresist layer 310.

In an example embodiment, the heat sink 230 may serve as an electrostatic chuck (ESC) that may fix the substrate 300 using an electrostatic force. For example, the heat sink 230 may be disposed in the ESC. In an example embodiment, a material having a high heat conductive rate, e.g., helium (He) may be disposed between the heat sink 230 and the substrate 300.

The controller 240 may control operations of the heat source 220 and the heat sink 230. Thus, the controller 240 may control the temperature of the substrate 300 between the heat source 220 and the heat sink 230, particularly, the temperature of the photoresist layer 310.

In example embodiments, the photoresist layer 310 on the substrate 300 may be provided between the heat source 220 and the heat sink 230 and may have a temperature gradient in the vertical direction. That is, heat provided by the heat source 220 and heat exhausted through the heat sink 230 may be controlled by the controller 240, and thus the temperature gradient may be formed between upper and lower surfaces of the photoresist layer 310 that may be disposed between the heat source 220 and the heat sink 230.

In an example embodiment, a difference between a temperature of the upper surface of the photoresist layer 310 and a temperature of the lower surface of the photoresist layer 310 may be in a range of about 0° C. to about 300° C. In some embodiments, the temperature difference between the upper surface and the lower surface of the photoresist layer 310 may be greater than 0° C. and up to about 300° C.

The heat source 220 and the heat sink 230 may be disposed in the upper portion and the lower portion, respectively, of the baking equipment 200, however, the inventive concept may not be limited thereto. For example, the heat source 220 and the heat sink 230 may be disposed in the lower portion and the upper portion, respectively, of the baking equipment 200. That is, the heat source 220 and the heat sink 230 may be disposed over and under the substrate 300 on which the photoresist layer 310 is formed and may be spaced apart from each other in the vertical direction so that the temperature gradient may be formed in the vertical direction in the photoresist layer 310.

Figure 7:
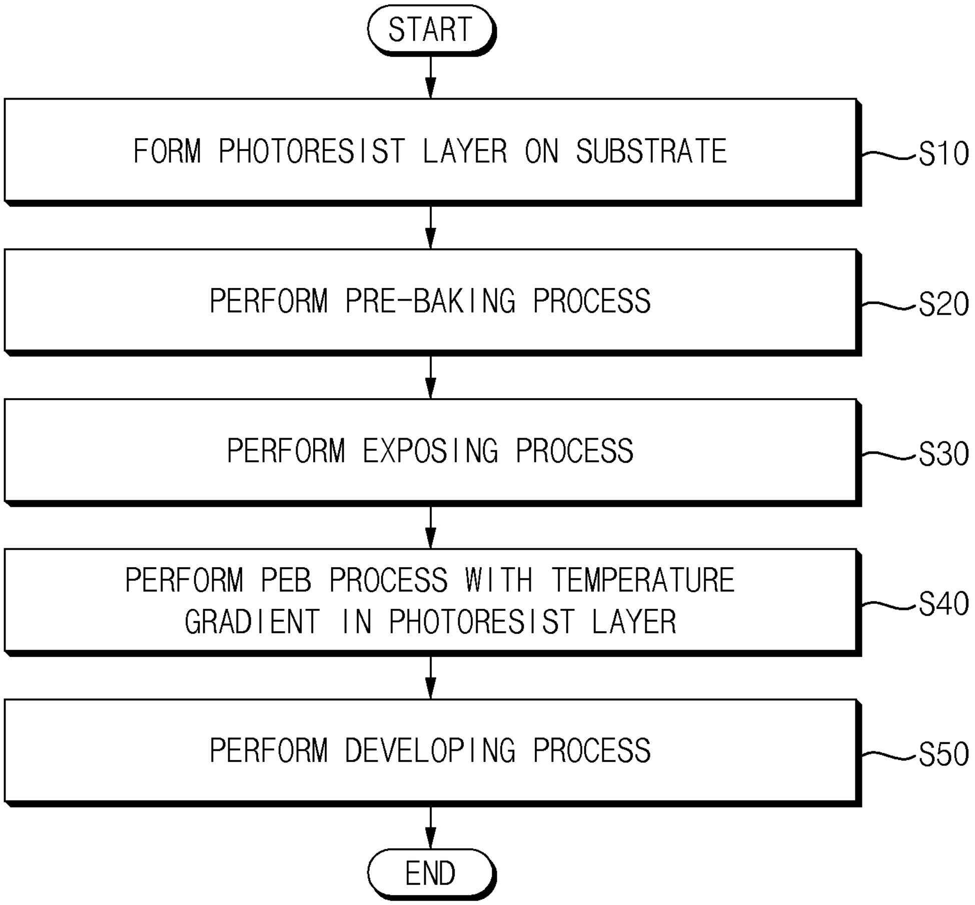
FIG. 7 is a flowchart illustrating a method of forming a photoresist pattern in accordance with example embodiments of the present inventive concept.
Figure 10:
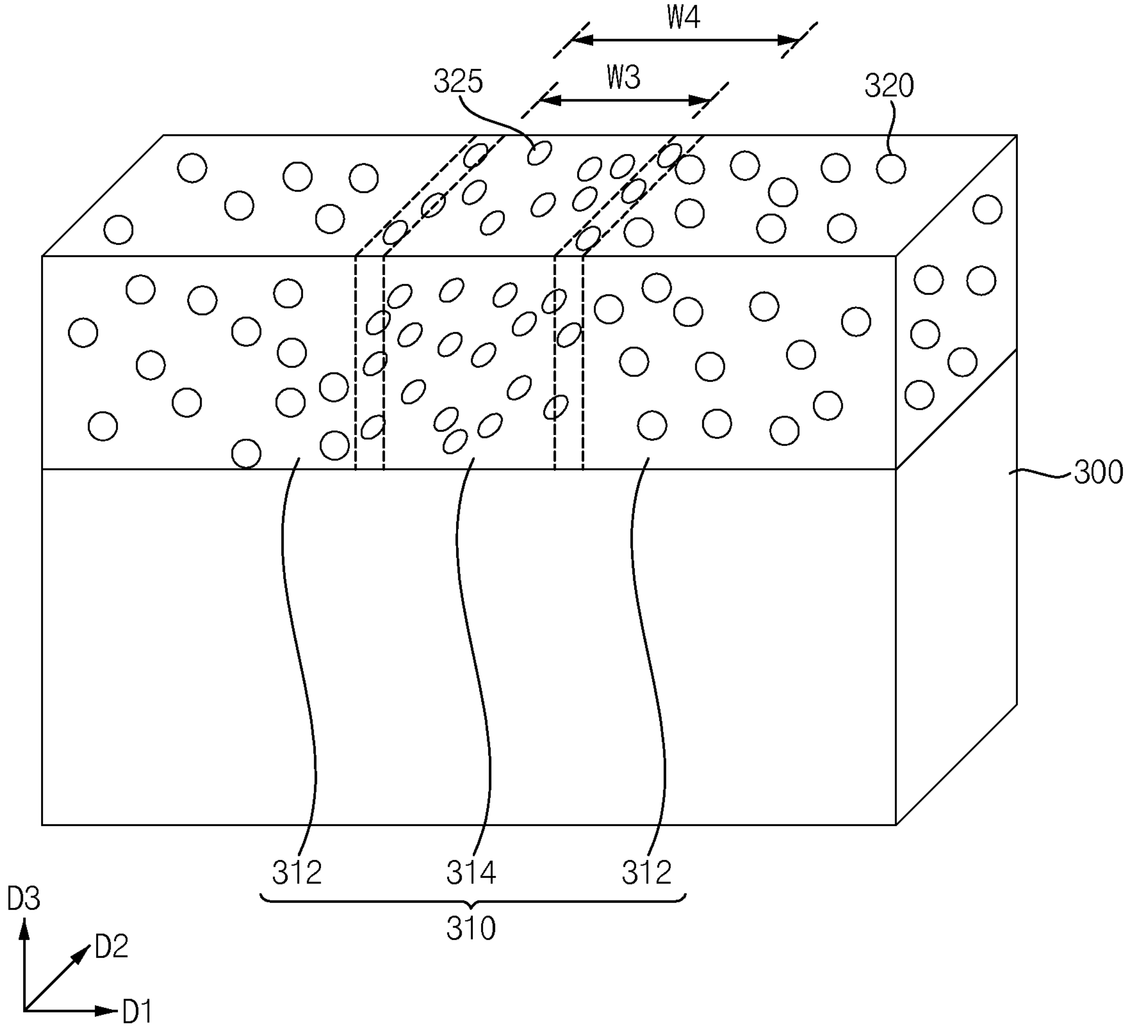
Figure 11:
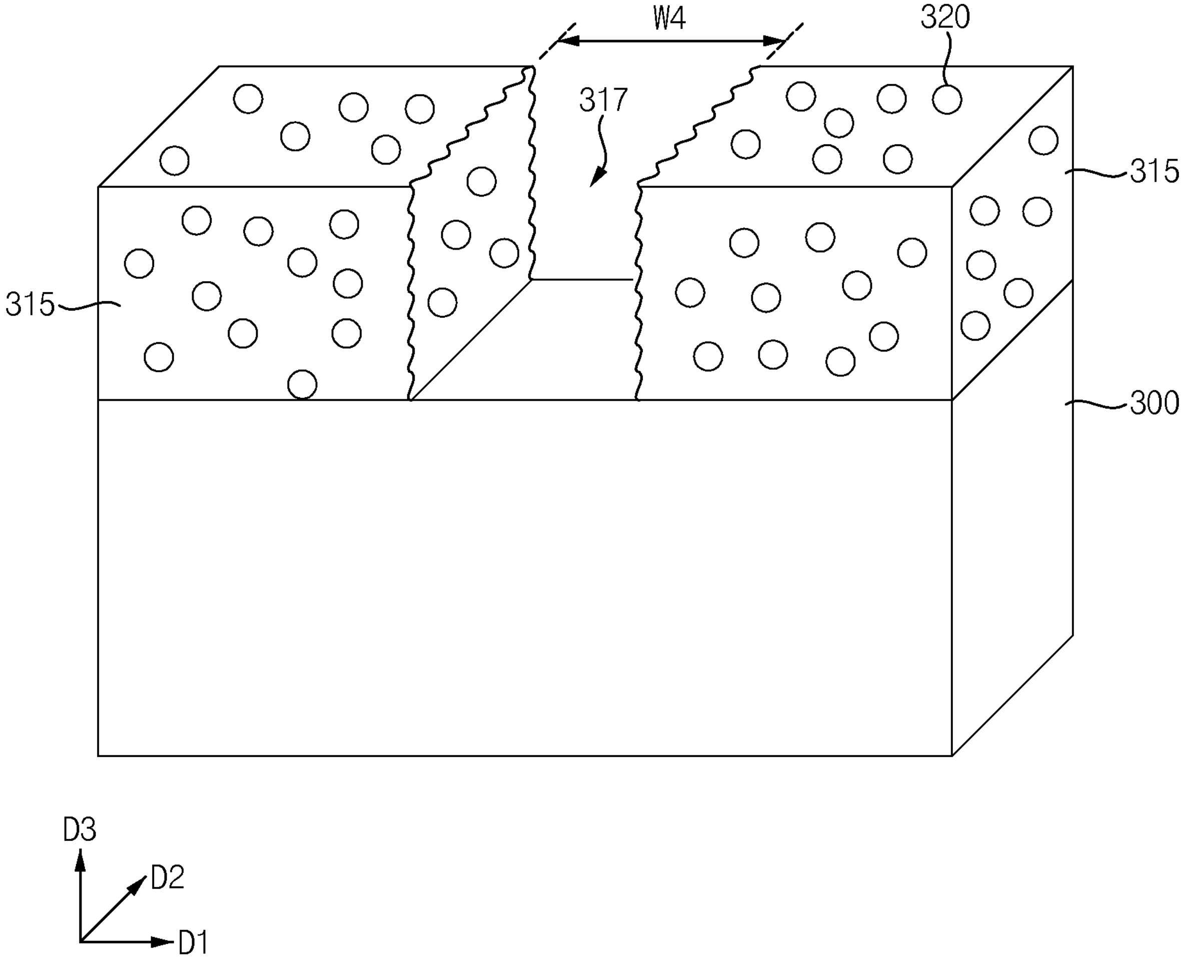
Figure 12:
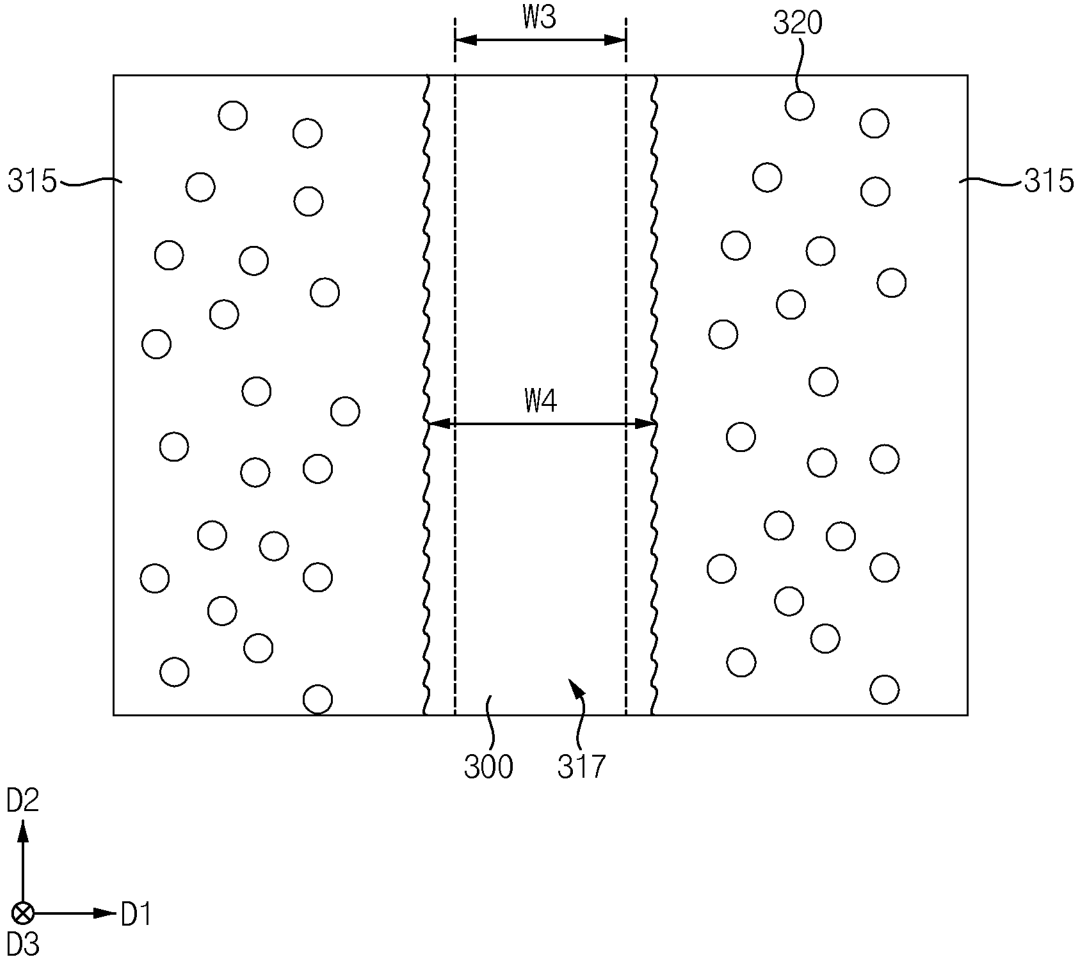
FIG. 12 is a plan view illustrating the method of forming the photoresist pattern in accordance with example embodiments of the present inventive concept.

FIG. 7 is a flowchart illustrating a method of forming a photoresist pattern in accordance with example embodiments of the present inventive concept, FIGS. 8 to 11 are perspective views illustrating the method of forming the photoresist pattern in accordance with example embodiments of the present inventive concept, and FIG. 12 is a plan view illustrating the method of forming the photoresist pattern in accordance with example embodiments of the present inventive concept.

Figure 8:
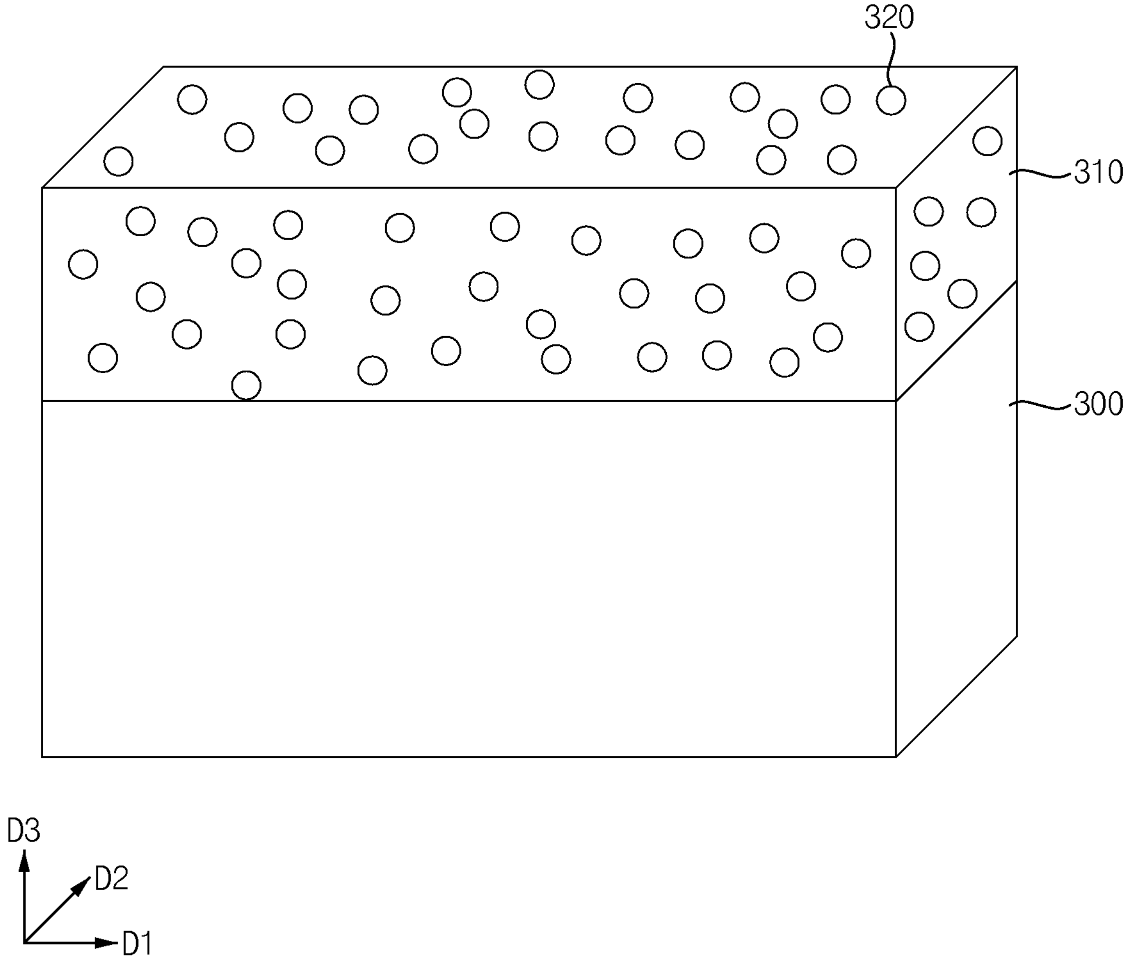
FIGS. 8 to 11 are perspective views illustrating the method of forming the photoresist pattern in accordance with example embodiments of the present inventive concept.

Referring to FIGS. 7 and 8, in step S10, the photoresist layer 310 may be formed on the substrate 300.

The substrate 300 may include silicon, germanium, silicon-germanium, or a III-V group compound semiconductor, such as GaP, GaAs, or GaSb. In example embodiments, the substrate 300 may be a silicon-on-insulator (SOI) substrate or a germanium-on-insulator (GOI) substrate.

In an example embodiment, the photoresist layer 310 may be formed on the substrate 300 by a spin coating process. In example embodiments, the photoresist layer 310 may be a chemical amplified resist (CAR), and may include polymers and PAGs 320 therein.

In step S20, a pre-baking process may be performed on the photoresist layer 310.

In an example embodiment, the pre-baking process may be performed in the baking equipment shown in FIG. 6. As the pre-baking process is performed, solvent and volatile materials included in the photoresist layer 310 may be removed.

Figure 9:
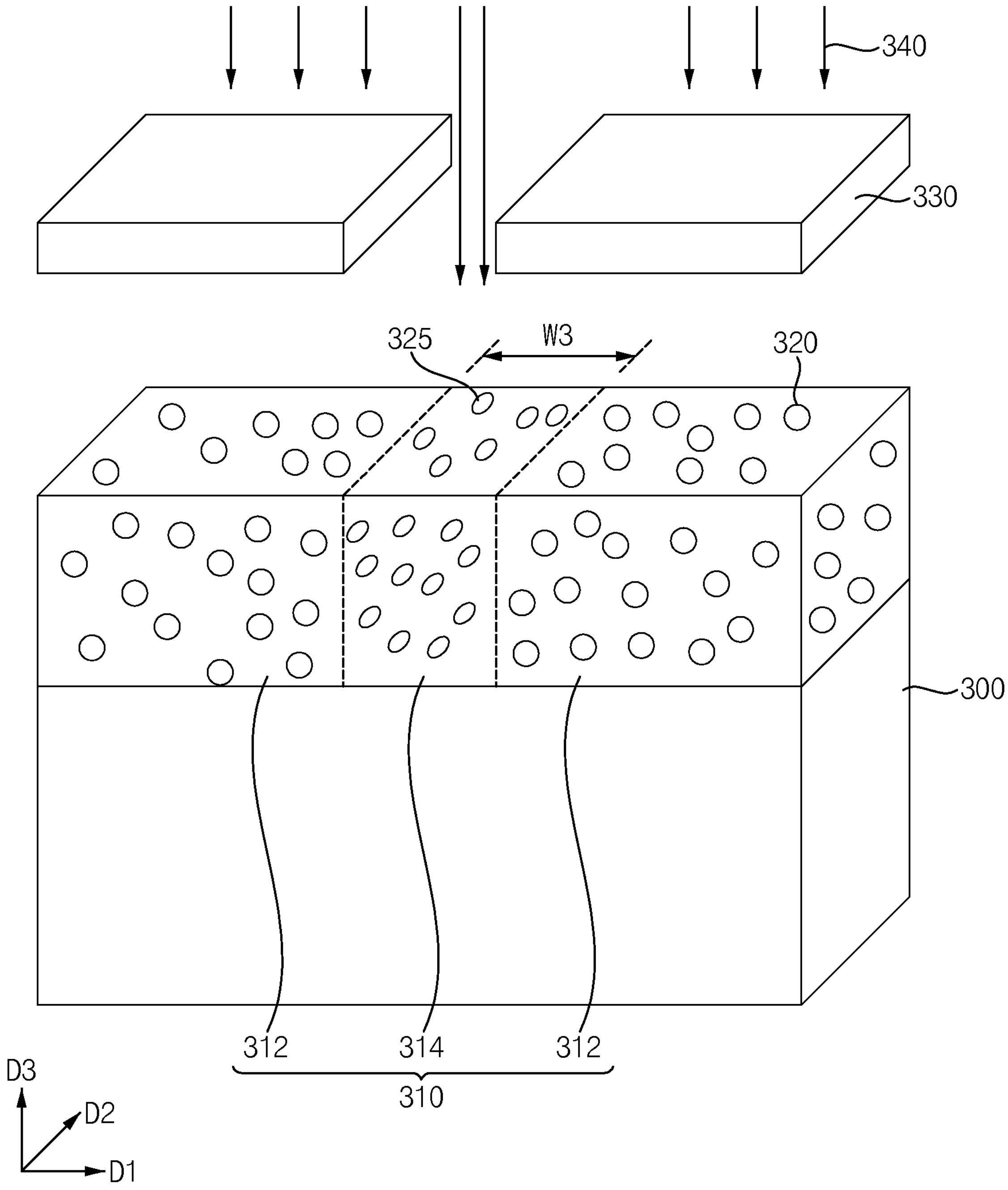

Referring to FIGS. 7 and 9, in step S30, a photomask 330 may be disposed over the photoresist layer 310, and an exposure process may be performed such that a light 340 may be irradiated onto the substrate 300.

As the exposure process is performed, the photoresist layer 310 may include an exposed portion 314 into which the light 340 is irradiated through the photomask 330 and a non-exposed portion 312 to which the light 340 is not irradiated by the photomask 330. The exposed portion 314 may have a third width W3 in the first direction D1.

As the exposure process is performed, acids 325 may be generated from the PAGs 320 in the exposed portion 314 of the photoresist layer 310.

Referring to FIGS. 7 and 10, in step S40, a post exposure baking (PEB) process may be performed on the photoresist layer 310.

The PEB process may be performed using the baking equipment shown in FIG. 6. Thus, during the PEB process, temperatures of the heat source 220 and the heat sink 230 respectively disposed over and under the substrate 300 may be controlled, and a temperature gradient may be formed in the vertical direction in the photoresist layer 310 that may be disposed between the heat source 220 and the heat sink 230. The PEB process may include providing the substrate 300 on which the photoresist layer 310 is formed into the baking chamber 210 that includes the heat source 220 and the heat sink 230, and the heat source 220 and the heat sink 230 may be spaced apart from each other in the vertical direction. In other words, the PEB process may include providing the substrate 300 on which the photoresist layer 310 is formed into a space between the heat source 220 and the heat sink 230 that may be spaced apart from each other in the vertical direction.

As the PEB process is performed with the temperature gradient in the vertical direction in the photoresist layer 310, the acids 325 in the exposed portion 314 of the photoresist layer 310 may diffuse into neighboring areas, however, the acids 325 may mainly diffuse not in a random direction but in the vertical direction substantially perpendicular to the upper surface of the substrate 300 by thermophoresis phenomenon in the photoresist layer 310. In some embodiments, an amount of the acids 325 diffusing in the vertical direction may be much greater than an amount of the acids 325 diffusing in other directions.

The thermophoresis phenomenon may be represented by following mathematical equation.

$$\frac{\partial \chi}{\partial t} = \nabla \cdot (D\nabla \chi + D_T\chi(1-\chi)\nabla T) \quad \text{< mathematical equation >}$$

$\chi$ is a particle concentration, D is a diffusion coefficient, and $D_T$ is a thermal diffusion coefficient.

A concentration change ($\partial\chi/\partial t$) of the acids 325 included in the photoresist layer 310 according to time, that is, a rate of movement of the acids 325 may be proportional to a temperature gradient ($\nabla$T) of the photoresist layer 310, and as time goes by, the acids 325 may mainly move to the upper surface of the photoresist layer 310 having a relatively high temperature by the heat source 220, or the lower surface of the photoresist layer 310 having a relatively low temperature by the heat sink 230.

Thus, during the PEB process, an amount of a movement in the vertical direction of the acids 325 may be greater than an amount of a random movement in the horizontal direction of the acids 325. The acids 325 may diffuse into the exposed portion 314 and a portion of the non-exposed portion 312 adjacent to the exposed portion 314 in the first direction D1, so as to exist in a portion of the photoresist layer 310 having a fourth width W4 that is greater than the third width W3 of the exposed portion 314 in the first direction D1. However, the fourth width W4 may be less than the second width W2 in the first direction D1 of the portion of the photoresist layer 10 in which the acids 25 exist after the PEB process in the comparative embodiment.

When the acids 325 diffuse into the exposed portion 314 and the portion of the non-exposed portion 312 adjacent to the exposed portion 314, the acids 325 may serve as a catalyst of deprotection reaction of the polymers.

Referring to FIGS. 7 and 11, in step S50, a development process may be performed on the photoresist layer 310 to form a photoresist pattern 315.

The development process may be performed using an alkaline developing solution, and during the development process, not only the exposed portion 314 but also the portion of the non-exposed portion 312 adjacent to the exposed portion 314 in which the acids 325 exist may be removed. Thus, a second opening 317 extending through the photoresist pattern 315 may have the fourth width W4 in the first direction D1 that is greater than the third width W3 of the exposed portion 314.

As described above, the amount of the vertical movement of the acids 325 may be greater the amount of the random horizontal movement of the acids 325 during the PEB process, and thus each of opposite sidewalls in the first direction D1 of the second opening 317 in the photoresist pattern 315 may have a nearly uniform slope.

Additionally, referring to FIG. 12, each of the opposite sidewalls in the first direction D1 of the second opening 317 in the photoresist pattern 315 may be in a nearly straight line in the second direction D2.

Thus, even though the photoresist pattern 315 may have the second opening 317 having the fourth width W4 in the first direction D1 that is somewhat greater than the third width W3, which is initially designed, the fourth width W4 in the first direction D1 of the second opening 317 may be nearly constant or uniform along both the second and third directions D2 and D3. Thus, the photoresist pattern 315 may have enhanced line edge roughness (LER) characteristics and enhanced line width roughness (LWR) characteristics.

As the photoresist pattern 315 may have the enhanced LER characteristics and the enhanced LWR characteristics, a pattern that may be formed by etching an etching object layer through an etching process using the photoresist pattern 315 as an etching mask may have a desired shape and size.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A method of forming a photoresist pattern, the method comprising:

forming a photoresist layer on a substrate, wherein the photoresist layer includes photo acid generators (PAGs);

performing an exposure process on the photoresist layer, wherein acids are generated from the PAGs during the exposure process;

performing a post exposure baking (PEB) process on the photoresist layer with a temperature gradient in the photoresist layer in a vertical direction perpendicular to an upper surface of the substrate such that the acids diffuse in the vertical direction during the PEB process, wherein the PEB process includes providing the substrate on which the photoresist layer is formed into a baking chamber comprising:

a heat source over an upper surface of the photoresist layer on the substrate; and a heat sink under a lower surface of the photoresist layer on the substrate; and performing a development process on the photoresist layer.

2. The method according to claim 1, wherein, in the PEB process, a temperature difference between upper and lower surfaces of the photoresist layer is greater than 0° C. and up to about 300° C.

3. The method according to claim 1, wherein the heat source includes a laser generator or a lamp heater, and wherein the heat sink includes a chill plate.

4. The method according to claim 3, wherein the chill plate contacts a lower surface of the substrate.

5. The method according to claim 1, further comprising, prior to performing the exposure process, performing a pre-baking process on the photoresist layer.

6. The method according to claim 1, wherein the photoresist layer is a chemical amplified resist (CAR).

7. A method of forming a photoresist pattern, the method comprising:

forming a photoresist layer on a substrate, wherein the photoresist layer includes photo acid generators (PAGs);

performing an exposure process on the photoresist layer, wherein acids are generated from the PAGs during the exposure process;

performing a post exposure baking (PEB) process on the photoresist layer by providing the substrate into a space between a heat sink and a heat source of a baking chamber such that the acids diffuse in a vertical direction during the PEB process, wherein the vertical direction is perpendicular to an upper surface of the substrate; and performing a development process on the photoresist layer.

8. The method according to claim 7, wherein the heat source and the heat sink are positioned in an upper portion and a lower portion, respectively, of the baking chamber.

9. The method according to claim 7, wherein the heat source includes a laser generator or a lamp heater, and wherein the heat sink includes a chill plate.

10. The method according to claim 9, wherein a lower surface of the substrate contacts an upper surface of the chill plate.

11. The method according to claim 7, wherein, in the PEB process, a temperature difference between upper and lower surfaces of the photoresist layer is greater than 0° C. and up to about 300° C.

12. The method according to claim 7, further comprising, prior to performing the exposure process, performing a pre-baking process on the photoresist layer.

13. The method according to claim 7, wherein the photoresist layer is a chemical amplified resist (CAR).

14. The method according to claim 1, wherein the development process is performed using an alkaline developing solution.

15. The method according to claim 1, wherein the heat sink serves as an electrostatic chuck (ESC) that fixed the substrate using an electrostatic force.

16. The method according to claim 1, further comprising placing helium (He) between the heat sink and the substrate.

17. The method according to claim 16, wherein the acids diffuse by thermophoresis.

18. The method according to claim 1, wherein an amount of the acids diffusing in the vertical direction is greater than an amount of the acids diffusing in other directions.

* * * * *